United States Patent [19]

Brown et al.

[11] Patent Number: 5,322,808

[45] Date of Patent: Jun. 21, 1994

[54] METHOD OF FABRICATING INVERTED MODULATION-DOPED HETEROSTRUCTURE

[75] Inventors: April S. Brown; Joseph A. Henige; Mark Lui; Loi Nguyen; Robert A. Metzger; William E. Stanchina, all of Thousand Oaks, Calif.

[73] Assignee: Hughes Aircraft Company, Los Angeles, Calif.

[21] Appl. No.: 20,095

[22] Filed: Feb. 19, 1993

Related U.S. Application Data

[63] Continuation of Ser. No. 748,218, Aug. 21, 1991, abandoned.

[51] Int. Cl.$^5$ .......................................... H01L 21/265
[52] U.S. Cl. ....................................... 437/40; 437/105; 437/108; 437/133; 437/248; 148/DIG. 72
[58] Field of Search ................. 437/126, 133, 105, 6, 437/129, 248, 108, 112, 40; 357/16, 22; 148/DIG. 169, DIG. 72

[56] References Cited

U.S. PATENT DOCUMENTS

| | | | |
|---|---|---|---|
| 4,859,625 | 8/1989 | Matsumoto | 148/DIG. 72 |
| 4,908,325 | 3/1990 | Berenz | 437/40 |
| 4,939,102 | 7/1990 | Hamm et al. | 437/31 |
| 5,024,967 | 6/1991 | Kopf et al. | 437/105 |

FOREIGN PATENT DOCUMENTS

| | | | |
|---|---|---|---|
| 0008815 | 1/1981 | Japan | 437/112 |
| 0256113 | 10/1989 | Japan | 437/108 |

OTHER PUBLICATIONS

"High Performance inverted HEMT and its application to LSI", S. Nishi et al., Inst. Phys. Conf. Ser. No. 83, 1987, pp. 515-520.

"Improved High Frequency Performance of AlInAs/GaInAs HBTs Through Use of Low Temperature GaInAs", W. Stanchina et al., InP and Related Compounds Conference Proceedings, Denver 1990, pp. 13-16.

"Si dopant migration and the AlGaAs/GaAs inverted interface", L. Pfeiffer et al., Appl. Phys. Lett. vol. 58, No. 20, May 20, 1991, pp. 2258-2260.

*Primary Examiner*—Brian E. Hearn
*Assistant Examiner*—Tuan Nguyen
*Attorney, Agent, or Firm*—V. D. Duraiswamy; W. K. Denson-Low

[57] ABSTRACT

A donor layer (17) including an undoped wide bandgap material (14) and an n-type dopant (16) is deposited on a substrate (12) by molecular beam epitaxy (MBE) at a first temperature which is high enough for optimal growth of the donor layer (17). The dopant (16) is silicon or another material which exhibits surface segregation in the wide bandgap material (14) at the first temperature. An undoped spacer layer (18) of the wide bandgap material is deposited on the donor layer (17) at a second temperature which is sufficiently lower than the first temperature that surface segregation of the dopant material from the donor layer (17) into the spacer layer (18) is substantially suppressed. A channel layer (20) of a narrow bandgap material is formed on the spacer layer (18) at a third temperature which is higher than the second temperature and selected for optimal growth of the channel layer (20). The spacer layer (18) is substantially undoped, and the low temperature growth and reduction of donor movement reduces ionized impurity scattering in the channel layer (20).

11 Claims, 2 Drawing Sheets

METHOD OF FABRICATING INVERTED MODULATION-DOPED HETEROSTRUCTURE

This is a continuation of U.S. patent application Ser. No. 07/748,218 filed Aug. 21, 1991, now abandoned.

BACKGROUND OF THE INVENTION

1. Field of the Invention

The present invention generally relates to the field of microelectronic transistor devices, and more specifically to a method of fabricating an improved heterostructure which is especially suited for an inverted modulation-doped, or high-electron-mobility transistor (HEMT).

2. Description of the Related Art

Gallium indium arsenide (GaInAs)/aluminum indium arsenide (AlInAs) based HEMTs fabricated on indium phosphide (InP) substrates currently exhibit the highest current gain cut-off frequencies, highest maximum frequencies of oscillation and lowest noise figure of any three terminal device. These HEMTs include a modulation-doped heterojunction at which an n-doped AlInAs donor layer provides electrons to form a two-dimensional electron gas (2DEG) in an undoped GaInAs channel layer. AlInAs is a wide bandgap material, whereas GaInAs is a narrow bandgap material.

In a conventional HEMT, the donor layer is formed above the channel layer, whereas in an inverted HEMT, the donor layer is formed below the channel layer. A double-doped HEMT structure is also known, including donor layers above and below the channel layer. The high performance of these HEMTs is due, in part, to the relatively high 2DEG concentration (greater than $3 \times 10^{12}/cm^2$) produced at the heterojunction, as well as the high mobility of electrons (greater than $10^4$ $cm^2/Vs$, lattice matched) in the undoped GaInAs channel.

HEMTs are preferably fabricated using molecular beam epitaxy (MBE). The process has been improved to reduce the substrate temperature from the previous value of 600° C. to 500° C. to reduce dopant diffusion in gallium arsenide (GaAs) based HEMTs, such as described in an article entitled "High performance inverted HEMT and its application to LSI", by S. Nishi et al, Inst. Phys. Conf. Ser. no. 83, 1987, pp. 515–520.

AlInAs/GaInAs HEMTs require an n-type dopant, usually silicon (Si), in the AlInAs donor layer. The Si may be distributed through the thickness of the donor layer, or may include a substantially planar layer of Si buried in an undoped AlInAs layer (delta or planar doping). Under normal MBE growth conditions at 500° C. or above, AlInAs/GaInAs HEMTs suffer from extrinsic degradation due to surface segregation of Si in AlInAs.

In normal HEMT structures in which the doping is above the AlInAs/GaInAs heterojunction, the segregation of Si toward the surface of the epitaxial layer leads to a degraded transfer efficiency of electrons into the 2DEG. To compensate, higher doping concentrations are then required to achieve a given 2DEG concentration, which in turn can degrade device performance by increasing the gate to drain capacitance.

In inverted HEMTs, in which the doping is typically less than 100 Angstroms below the AlInAs/GaInAs heterojunction, the segregation of Si leads to dramatically reduced mobility of the 2DEG due to ionized impurity scattering, and consequently poor conductivity in inverted as well as double-doped HEMTs. This is much more deleterious than the problems caused by surface segregation in the conventional HEMT structure.

The use of spacer layers grown at low temperatures on the order of 300° C. to slow beryllium (Be) diffusion out of GaInAs P base layers in heterojunction bipolar transistors (HBTs) is known, such as described in an article entitled "IMPROVED HIGH FREQUENCY PERFORMANCE OF AlInAs/GaInAs HBTs THROUGH USE OF LOW TEMPERATURE GaInAs", by W. Stanchina et al, in InP and Related Compounds Conference Proceedings, Denver 1990, pp. 13–16.

However, Si is a relatively large atom, and does not diffuse in AlInAs as does a relatively small atom such as Be in GaInAs. In surface segregation, the large Si atoms "float" toward the surface of an AlInAs layer at 500° C. or above during MBE growth, whereas in diffusion the relatively small Be atoms migrate throughout the layer.

As discussed in an article entitled "Si dopant migration and the AlGaAs/GaAs inverted interface", by L. Pfeiffer et al, Appl. Phys. Lett. Vol. 58, No. 20, May 20, 1991, pp. 2258–2260, low temperature MBE would be expected to produce non-optimal growth conditions in AlGaAs which would result in new problems such as deviations from stoichiometry, increases in impurity sticking coefficients during growth, and increased alGaAs roughness. The solution described by Pfeiffer involves the formation of a spacer layer at the normal growth temperature of 640° C. which is much thicker (800 Angstroms) than conventional spacers (400 Angstroms).

SUMMARY OF THE INVENTION

The present method is based on the discovery that in an inverted, modulation-doped heterojunction structure, preferably an AlInAs/GaInAs HEMT, a spacer layer grown by MBE between the donor and channel layers at a low substrate temperature of approximately 300° C.–350° C. suppresses surface segregation of Si toward the growth surface during fabrication, without degrading the operation cf the device as would be expected due to the non-optimal growth conditions of the spacer layer.

In accordance with the present invention, a donor layer including an undoped wide bandgap material, preferably AlInAs, and an n-type dopant is deposited on a substrate by molecular beam epitaxy (MBE) at a first temperature which is high enough for optimal growth of the donor layer. The dopant is Si or another material which exhibits surface segregation in the wide bandgap material at the first temperature.

An undoped spacer layer of the wide bandgap material is deposited on the donor layer at a second temperature which is sufficiently lower than the first temperature that surface segregation of the dopant material from the donor layer into the spacer layer is substantially suppressed. A channel layer of a narrow bandgap material, preferably GaInAs, is formed on the spacer layer at a third temperature which is selected for optimal growth of the channel layer.

The low temperature spacer layer is substantially undoped, and holds back the Si, greatly reducing the ionized impurity scattering in the channel layer. This enables inverted HEMTs and other modulation-doped heterojunction structures to be fabricated with high 2DEG concentration and electron mobility.

The present method is especially suited to the fabrication of inverted AlInAs/GaInAs HEMTs on InP substrates, although a modulation-doped heterojunction structure fabricated in accordance with the invention is applicable to other devices, such as double-doped HEMTs, and other material systems.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
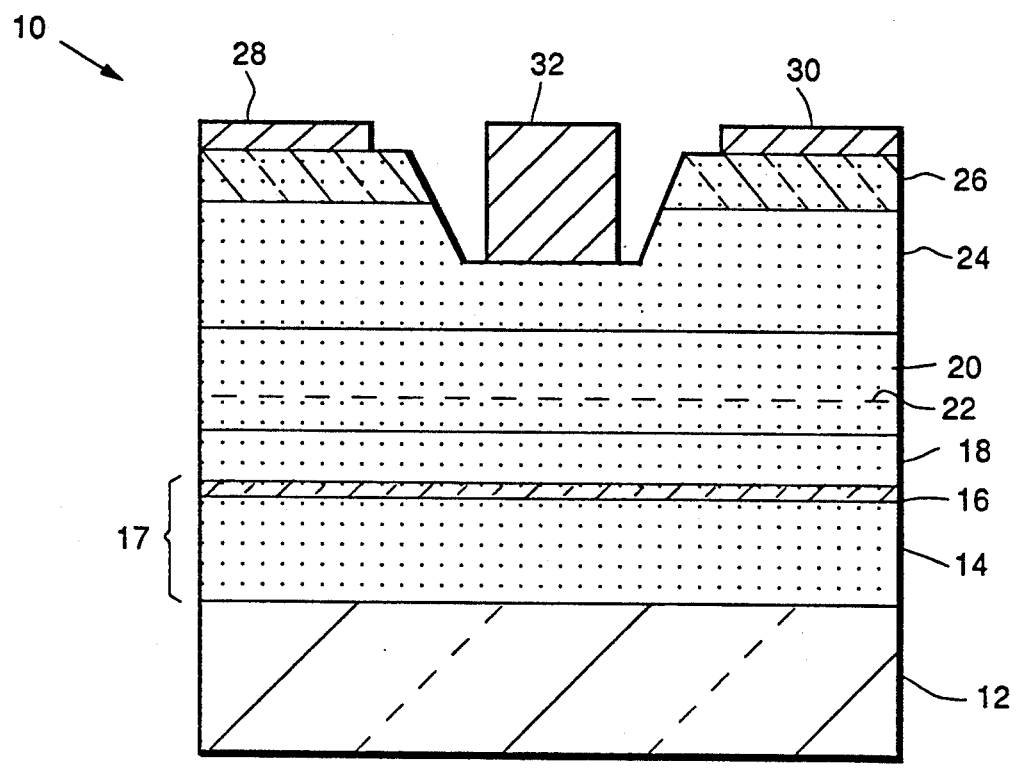
FIG. 1 is a simplified sectional view illustrating an inverted high-electron-mobility transistor (HEMT) fabricated in accordance with a method of the present invention.

Referring now to FIG. 1 of the drawing, an inverted AlInAs/GaInAs HEMT including a modulation-doped heterostructure fabricated according to the present method is generally designated as 10 and includes an InP substrate 12. A buffer layer 14 of AlInAs, which is a wide bandgap material, is epitaxially deposited on the substrate 12 to a thickness of approximately 2500 Angstroms.

The HEMT 10 is illustrated as being a delta doped structure, with the AlInAs layer 14 being substantially undoped. A substantially planar doping 16 of AlInAs of Si having a concentration of approximately $5 \times 10^{12}$ atoms/cm$^2$ is deposited on the buffer layer 14. Si is an n-type or donor dopant, which supplies electrons for the 2DEG of the HEMT 10.

Although not specifically illustrated, it is further within the scope of the invention to distribute the Si dopant throughout or in the upper portion of the layer 14. In the case of either delta or distributed doping, the buffer layer 14 and doping 16 in combination are considered to constitute a donor layer 17.

In accordance with the present invention, a substantially undoped AlInAs spacer layer 18 approximately 60 Angstroms thick is deposited at reduced temperature on the donor layer 17. As will be understood from further description, surface segregation of Si from the donor layer 17 into the spacer layer 18 is suppressed due to the low temperature growth of the spacer layer 18.

A channel layer 20 of undoped GaInAs, which is a narrow bandgap material, is formed on the spacer layer 18 to a thickness of approximately 50–200 Angstroms. The donor layer 17 and channel layer 20 form a modulation-doped heterojunction which causes a 2DEG to be created in the channel layer 20 as indicated at 22.

A 200 Angstrom thick Schottky layer 24 of undoped AlInAs and a 70 Angstrom thick cap layer 26 of N+ doped GaInAs are deposited over the channel layer 20. A source contact 28 and a drain contact 30 are formed on the cap layer 26. A gate contact 32 is formed on the Schottky layer 24 in a recess between the contacts 28 and 30. 2DEG current flow through the channel layer 20 between the source and drain contacts 28 and 30 is modulated by an electric field resulting from a voltage applied to the gate contact 32 in a known manner.

Figure 2:
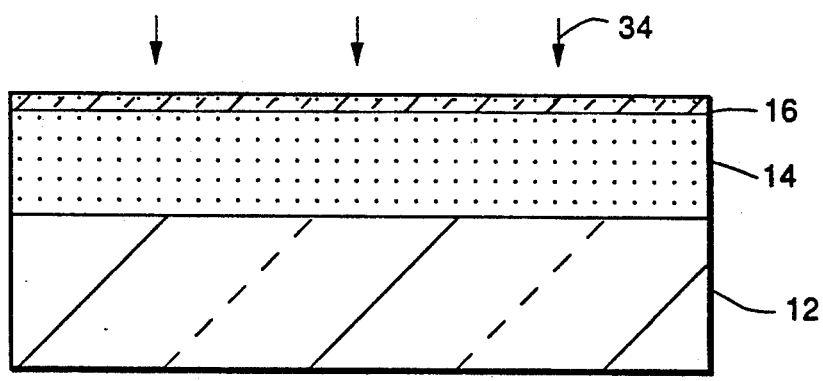
FIGS. 2 to 4 are simplified sectional views illustrating the steps of the present method.
Figure 3:
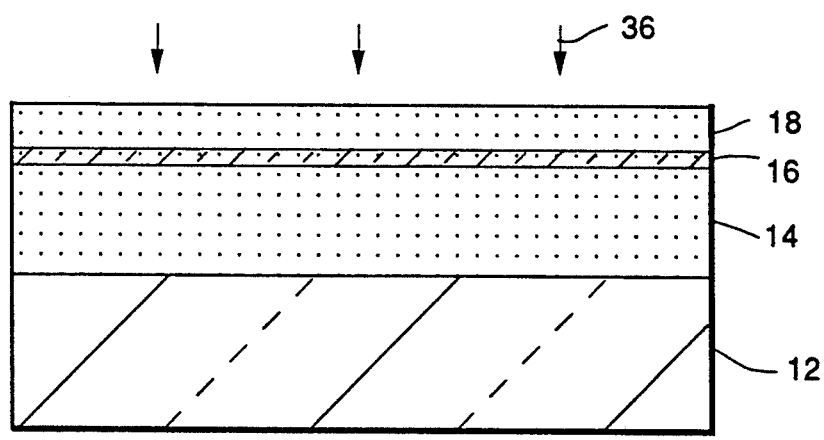
Figure 4:
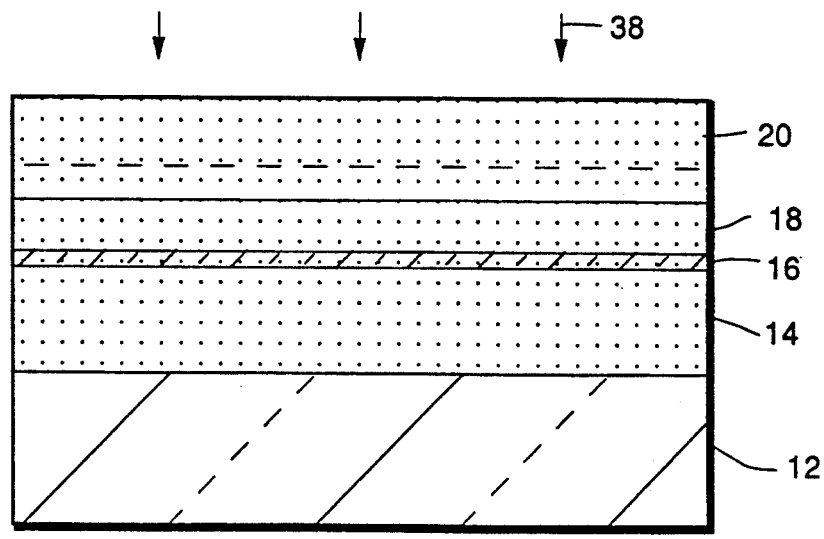

FIGS. 2 to 4 illustrate how the present HEMT 10 may be fabricated using a conventional MBE apparatus according to the method of the present invention. In FIG. 1, the donor layer 17 including the undoped AlInAs buffer layer 14 and Si delta doping 16 are deposited on the substrate 12 as indicated by arrows 34 at a conventional substrate temperature of 500° C. or greater, which is selected such that the donor layer 17 will have sufficiently high qualities or properties for device operation.

Deposition is then temporarily suspended, and the temperature of the substrate 12 is reduced by 150° C.–200° C. to a lower value of approximately 300° C.–350° C. which is sufficiently low that surface segregation of Si is substantially suppressed. During the time required for the substrate temperature to stabilize at the lower value, As is caused to impinge on the donor layer 17 to prevent degradation of the surface state thereof.

As illustrated in FIG. 3, the AlInAs spacer layer 18 is deposited on the donor layer 17 at the reduced temperature as indicated by arrows 36. Since surface segregation of Si from the donor layer 17 into the spacer layer 18 is suppressed, the spacer layer 18 is substantially undoped.

Deposition is again temporarily suspended, and the temperature of the substrate 12 increased to a conventional value of 500° C. or greater, which is selected such that the channel layer 20 will have sufficiently high qualities or properties for device operation. As illustrated in FIG. 4, the channel layer 20 is deposited on the spacer layer 18 as indicated by arrows 38 after the substrate temperature has stabilized at the higher value.

It will be understood that although the deposition temperature at which the channel layer 20 has optimal properties using the AlInAs/GaInAs material system as described above is higher than the deposition temperature for the spacer layer 18, the optimal deposition temperature for the channel layer 20 may be equal to or lower than the deposition temperature for the spacer layer 18 using a different material system. For example, the channel layer 20 may be deposited in the form of a strained InAs layer at approximately the same temperature as the spacer layer 18.

Subsequent to the step of FIG. 4, the Schottky layer 24, cap layer 26 and contacts 28, 30 and 32 are formed in a conventional manner to produce the complete HEMT 10 illustrated in FIG. 1.

The low temperature spacer layer 18 results in substantially increased 2DEG concentration and electron mobility over the prior art. The present method of low temperature spacer growth to suppress dopant surface segregation is further applicable to other types of devices, such as double-doped heterojunction structures, and other material systems although not specifically shown or described.

EXAMPLE

Inverted HEMTs having the structure described above with reference to FIG. 1 were fabricated in accordance with the method illustrated with reference to FIGS. 2 to 4, with buffer layer 14, doping 16 and channel layer 20 deposited at 500° C., and the spacer layer 18 deposited at 350° C. For comparison, HEMTs having the same structure were fabricated with all of these layers deposited at 500° C.

The HEMTs having the spacer layer deposited at low temperature in accordance with the present invention had 2DEG concentration as high as $3 \times 10^{12}$/cm$^2$, and electron mobility as high as 9,700 cm$^2$/Vs. The comparison devices having the spacer layer deposited at the conventional high temperature had 2DEG concentration below $3 \times 10^{12}$/cm$^2$, and electron mobility below 6,000 cm$^2$/Vs.

Double-doped HEMTs were also fabricated using low temperature spacer growth, and had 2DEG concentration as high as $5.4 \times 10^{12}$/cm$^2$, and electron mobility as high as 10,400 cm$^2$/Vs.

While an illustrative embodiment of the invention has been shown and described, numerous variations and alternate embodiments will occur to those skilled in the art, without departing from the spirit and scope of the invention. Accordingly, it is intended that the present invention not be limited solely to the specifically described illustrative embodiment. Various modifications are contemplated and can be made without departing from the spirit and scope of the invention as defined by the appended claims.

We claim:

1. A method of fabricating a modulation-doped heterostructure, comprising the steps of:
    (a) depositing a first layer including an undoped wide bandgap material and a silicon dopant material on a substrate at a first temperature of about 500° C. or greater which is selected such that the first layer will have predetermined properties, the silicon dopant material exhibiting surface segregation in the undoped wide bandgap material at the first temperature;
    (b) cooling the substrate to a second temperature having a lower value of about 300° C. to 350° C. while deposition is temporarily suspended;
    (c) depositing a second layer of the undoped wide bandgap material over the first layer at the second temperature of about 300° C. to 350° C. which is sufficiently lower than the first temperature so that surface segregation of the silicon dopant in the undoped wide bandgap material is substantially suppressed;
    (d) changing the temperature of the substrate to a third temperature having a value which is selected such that a third layer of an undoped narrow bandgap material deposited over the second layer at the third temperature will have predetermined properties, deposition being temporarily suspended during the temperature change, and
    (e) depositing the third layer at the third temperature which is selected such that the third layer will have predetermined properties.

2. A method as in claim 1, in which steps (a), (b) and (c) comprise depositing the first, second and third layers respectively using molecular beam epitaxy (MBE), with the first, second and third temperatures being the temperatures of the substrate during said respective steps.

3. A method as in claim 1, in which:
    steps (a) and (b) comprise depositing the first and second layers such that the undoped wide bandgap material is aluminum indium arsenide (AlInAs); and
    step (c) comprises depositing the third layer such that the undoped narrow bandgap material is gallium indium arsenide (GaInAs).

4. A method as in claim 3, in which steps (a) and (b) comprise depositing the first and second layers respectively with the first temperature being approximately 150° C.–200° C. higher than the second temperature.

5. A method as in claim 1, in which step (c) comprises depositing the third layer with the third temperature being higher than the second temperature.

6. A method of fabricating an inverted high-electron-mobility transistor (HEMT) heterostructure, comprising the steps of:
    (a) depositing a donor layer including an undoped wide bandgap material of aluminum indium arsenide (AlInAs) and a silicon donor dopant material on a substrate of indium phosphide (InP) at a first temperature of about 500° C. or greater selected such that the donor layer will have predetermined properties, the silicon dopant material exhibiting surface segregation in the undoped AlInAs wide bandgap material at the first temperature;
    (b) cooling the substrate to a second temperature having a lower value of about 300° C. to 350° C. while deposition is temporarily suspended;
    (c) allowing arsenic (As) to impinge on the donor layer to prevent the degradation of the surface state thereof during the period when deposition is temporarily suspended and until the substrate temperature stabilizes at the second temperature;
    (d) depositing a spacer layer of the undoped aIInAs wide bandgap material over the donor layer at the second temperature of about 300° C. to 350° C. which is sufficiently lower than the first temperature so that surface segregation of the silicon dopant in the spacer layer is substantially suppressed;
    (e) increasing the temperature of the substrate to a third temperature having a value of about 500° C. or greater while deposition is temporarily suspended, and
    (f) depositing a channel layer of an undoped narrow bandgap material of gallium indium arsenide (GaInAs) over the spacer layer at the third temperature of about 500° C. or greater which is selected such that the channel layer will have predetermined properties.

7. A method as in claim 6, in which steps (a), (b) and (c) comprise depositing the donor, spacer and channel layers respectively using molecular beam epitaxy (MBE), with the first, second and third temperatures being the temperatures of the substrate during said respective steps.

8. A method as in claim 6, in which steps (a) and (b) comprise depositing the donor and spacer layers respectively with the first temperature being approximately 150° C.–200° C. higher than the second temperature.

9. A method as in claim 6, in which step (c) comprises depositing the channel layer with the third temperature being higher than the second temperature.

10. A method as in claim 6, in which step (b) comprises depositing the spacer layer to a thickness of approximately 60 Angstroms.

11. A method as in claim 6, in which step (a) comprises depositing the donor layer in the form of a substantially planar layer of the donor dopant material buried in the undoped wide bandgap material.

* * * * *